United States Patent
Li et al.

(10) Patent No.: US 10,825,526 B1
(45) Date of Patent: Nov. 3, 2020

(54) NON-VOLATILE MEMORY WITH REDUCED DATA CACHE BUFFER

(71) Applicant: SanDisk Technologies LLC, Addison, TX (US)

(72) Inventors: YenLung Li, San Jose, CA (US); Hua-Ling Cynthia Hsu, Milpitas, CA (US); Chen Chen, Mountain View, CA (US); Min Peng, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/450,042

(22) Filed: Jun. 24, 2019

(51) Int. Cl.
G11C 16/26 (2006.01)
G11C 16/10 (2006.01)
G11C 16/04 (2006.01)
G11C 11/56 (2006.01)

(52) U.S. Cl.
CPC .......... *G11C 16/10* (2013.01); *G11C 11/5628* (2013.01); *G11C 11/5642* (2013.01); *G11C 11/5671* (2013.01); *G11C 16/0483* (2013.01); *G11C 16/26* (2013.01)

(58) Field of Classification Search
CPC .................................. G11C 7/22; G11C 16/26
USPC .......................................... 365/185.11, 233.5
See application file for complete search history.

(56) References Cited

U.S. PATENT DOCUMENTS

| | | | |
|---|---|---|---|
| 5,072,377 A | 12/1991 | Asai et al. | |
| 5,200,925 A * | 4/1993 | Morooka | G11C 7/103 345/545 |
| 5,323,387 A | 6/1994 | Miyata et al. | |
| 5,434,990 A * | 7/1995 | Moussavi | G06F 12/0851 392/425 |
| 5,630,048 A | 5/1997 | La Joie et al. | |
| 5,896,317 A * | 4/1999 | Ishii | G11C 16/10 365/185.12 |
| 6,040,997 A * | 3/2000 | Estakhri | G11C 16/102 365/185.33 |
| 6,239,815 B1 | 5/2001 | Frink et al. | |
| 6,353,553 B1 | 3/2002 | Tamada et al. | |
| 7,577,037 B2 * | 8/2009 | Li | G06F 12/0893 365/185.22 |
| 8,634,248 B1 | 1/2014 | Sprouse et al. | |
| 8,842,473 B2 | 9/2014 | Tsai | |
| 8,902,647 B1 | 12/2014 | Raghu et al. | |

(Continued)

OTHER PUBLICATIONS

U.S. Appl. No. 16/450,058, filed Jun. 14, 2019 by Li et al.

(Continued)

*Primary Examiner* — Michael T Tran
(74) *Attorney, Agent, or Firm* — Vierra Magen Marcus LLP

(57) ABSTRACT

In non-volatile memory circuit, the area devoted to the cache buffer of the read and write circuitry is reduced through the sharing of data latches. In an array structure where memory cells are connected along bit lines, and the bit lines organized into columns, each of the columns has an associated set of data latches, including one or more data latches for each bit line of the column. Data is transferred in and out of the read and write circuit on a data bus, where data is transferred between the data latches and the data bus through a set of transfers latches. The area used by the latch structure is reduced by sharing the transfer latches of the read and write circuitry between the data latches of multiple columns.

19 Claims, 14 Drawing Sheets

(56) References Cited

U.S. PATENT DOCUMENTS

| | | | |
|---|---|---|---|
| 9,431,120 B1 | 8/2016 | Tuers et al. | |
| 9,824,770 B1* | 11/2017 | Fujiwara | G11C 29/76 |
| 10,262,704 B1* | 4/2019 | Sato | H03K 3/037 |
| 10,373,697 B1* | 8/2019 | Lai | G11C 16/3445 |
| 10,466,903 B2* | 11/2019 | Benisty | G06F 3/0679 |
| 10,467,146 B1 | 11/2019 | Miyamura et al. | |
| 10,521,118 B2* | 12/2019 | Benisty | G06F 3/0659 |
| 2003/0116763 A1* | 6/2003 | Yamazaki | G11C 29/1201 257/48 |
| 2003/0197201 A1* | 10/2003 | Yanagawa | G11C 7/1051 257/200 |
| 2003/0218925 A1 | 11/2003 | Torjussen et al. | |
| 2004/0044812 A1 | 3/2004 | Holm et al. | |
| 2004/0066669 A1 | 4/2004 | Ooishi | |
| 2005/0273670 A1 | 12/2005 | Park | |
| 2007/0223292 A1 | 9/2007 | Moogat et al. | |
| 2008/0028108 A1* | 1/2008 | Sawai | G06F 13/28 710/22 |
| 2008/0282041 A1 | 11/2008 | Hartwich et al. | |
| 2009/0271536 A1* | 10/2009 | Tiennot | G06F 13/28 710/28 |
| 2009/0303801 A1* | 12/2009 | Kim | G11C 13/025 365/189.05 |
| 2012/0113716 A1 | 5/2012 | Liu et al. | |
| 2014/0075259 A1 | 3/2014 | Tam | |
| 2014/0136762 A1 | 5/2014 | Li et al. | |
| 2014/0136763 A1 | 5/2014 | Li et al. | |
| 2014/0136764 A1 | 5/2014 | Li et al. | |
| 2014/0169092 A1* | 6/2014 | Miyamoto | G11C 16/24 365/185.09 |
| 2014/0258606 A1* | 9/2014 | Nakanishi | G06F 12/0246 711/105 |
| 2014/0298075 A1 | 10/2014 | Rao | |
| 2014/0380117 A1* | 12/2014 | Hirano | G11C 29/78 714/758 |
| 2015/0003156 A1 | 1/2015 | Berckmann et al. | |
| 2015/0071001 A1* | 3/2015 | Kanagawa | G11C 7/10 365/185.17 |
| 2016/0163382 A1 | 6/2016 | Conley | |
| 2016/0258997 A1* | 9/2016 | Tang | H04L 25/0278 |
| 2016/0365154 A1 | 12/2016 | Nagadomi et al. | |
| 2017/0097869 A1 | 4/2017 | Sharon et al. | |
| 2017/0115342 A1* | 4/2017 | Wang | G11C 16/0483 |
| 2017/0117036 A1* | 4/2017 | Al-Shamma | G11C 29/021 |
| 2017/0153974 A1* | 6/2017 | Jin | G11C 8/06 |
| 2017/0371539 A1* | 12/2017 | Mai | G06F 3/0673 |
| 2018/0024926 A1* | 1/2018 | Penney | G06F 12/0215 711/141 |
| 2018/0054190 A1* | 2/2018 | Takagiwa | H03K 3/356147 |
| 2018/0075902 A1* | 3/2018 | Shirakawa | G11C 11/5628 |
| 2018/0136851 A1* | 5/2018 | Batra | G06F 3/0688 |
| 2018/0173444 A1* | 6/2018 | Marcu | G06F 3/0679 |
| 2018/0203613 A1* | 7/2018 | Tanzawa | H01L 27/11582 |
| 2018/0239531 A1* | 8/2018 | Lea | G11C 11/4087 |
| 2018/0300208 A1 | 10/2018 | Oruganti et al. | |
| 2018/0330793 A1* | 11/2018 | Tang | G11C 16/225 |
| 2019/0050169 A1 | 2/2019 | Komai | |
| 2019/0057746 A1 | 2/2019 | Komai | |
| 2019/0189215 A1* | 6/2019 | Yang | G11C 16/24 |
| 2019/0303236 A1 | 10/2019 | Ellis et al. | |
| 2019/0371406 A1* | 12/2019 | Yang | G11C 16/10 |
| 2020/0119735 A1* | 4/2020 | Finkbeiner | G06F 3/0625 |
| 2020/0145599 A1* | 5/2020 | Matsuzaki | H03K 5/249 |
| 2020/0151053 A1* | 5/2020 | Cha | G06F 11/1048 |
| 2020/0152282 A1* | 5/2020 | Yang | G11C 16/3495 |
| 2020/0167087 A1* | 5/2020 | Christensen | G11C 16/10 |
| 2020/0168175 A1* | 5/2020 | Tsuchi | G09G 3/3688 |

OTHER PUBLICATIONS

Notice of Allowance dated Apr. 9, 2020, U.S. Appl. No. 16/450,058, filed Jun. 24, 2019.

International Search Report & The Written Opinion of the International Searching Authority dated Mar. 31, 2020, International Application No. PCT/US2019/066422.

Notice of Allowance dated Jun. 17, 2020, U.S. Appl. No. 16/450,058, filed Jun. 24, 2018.

International Search Report & The Written Opinion of the International Searching Authority dated Apr. 7, 2020, International Application No. PCT/US2019/066421.

* cited by examiner

NON-VOLATILE MEMORY WITH REDUCED DATA CACHE BUFFER

BACKGROUND

The present disclosure relates to technology for non-volatile storage.

Semiconductor memory is used in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories. Typically, the memory device has a memory controller and one or more memory packages. The memory package has one or more logical units. As one example, each logical unit can be a separate memory die. Each memory die contains non-volatile storage elements (e.g., non-volatile memory cells), as well as read and write circuitry. The memory package also contains addressing circuitry in order to properly address the memory cells. As one example, the memory package includes NAND flash memory. However, memory packages other than NAND flash are known.

The read and write circuitry on a memory die include a number of latches to buffer data being read out of and programmed into the array of memory cells on the die. The number of such latches is related to the number of memory cells sensed concurrently, the format of the data (the number of data states stored in a cell), and other factors. The number and arrangement of the data latches can affect performance as they can determine how efficiently data can be transferred on and off a memory die. As the number of circuits in the data latch structure can be quite large, this can consume a non-negligible area of the memory die that could otherwise be used for memory cells. Consequently, the detail of the memory latch structure on a non-volatile memory die can be have significance for both the performance and storage density of the memory device.

BRIEF DESCRIPTION OF THE DRAWINGS

FIG. 6 illustrates the layout of the bit lines and sense amplifiers into columns.

DETAILED DESCRIPTION

For a non-volatile memory device formed on an integrated circuit of a given size, part of the die is used for the memory cells and part of the die is used form peripheral elements, such as read and write circuitry. The capacity of a memory device is dependent on the density of memory cells on the die, the number of data states stored in each of the memory cells, and area of the die used by the memory cells. For a die of a given size, the area of the die available for the memory cells can be increased by reducing the portion of the integrated circuit used by the peripheral elements.

To reduce the area devoted to the cache buffer of the read and write circuitry, embodiments described below share portions of the latch structure. In a memory array structure where memory cells are connected along bit lines, and the bit lines organized into columns, each of the columns has an associated set of data latches. The data latches associated with each column includes one or more data latches for each bit line of the column, where the data latches can be used for read and write operations. In a multi-level cell (MLC) embodiment, each of the bit lines can have multiple associated data latches. Data is transferred in and out of the read and write circuitry on an internal bus structure, where the data for each of the columns is transferred between the associated data latches and the memory chip's data bus through a set of transfers latches. The area used by the latch structure is reduced by sharing the transfer latches between the data latches of multiple columns.

Figure 1:
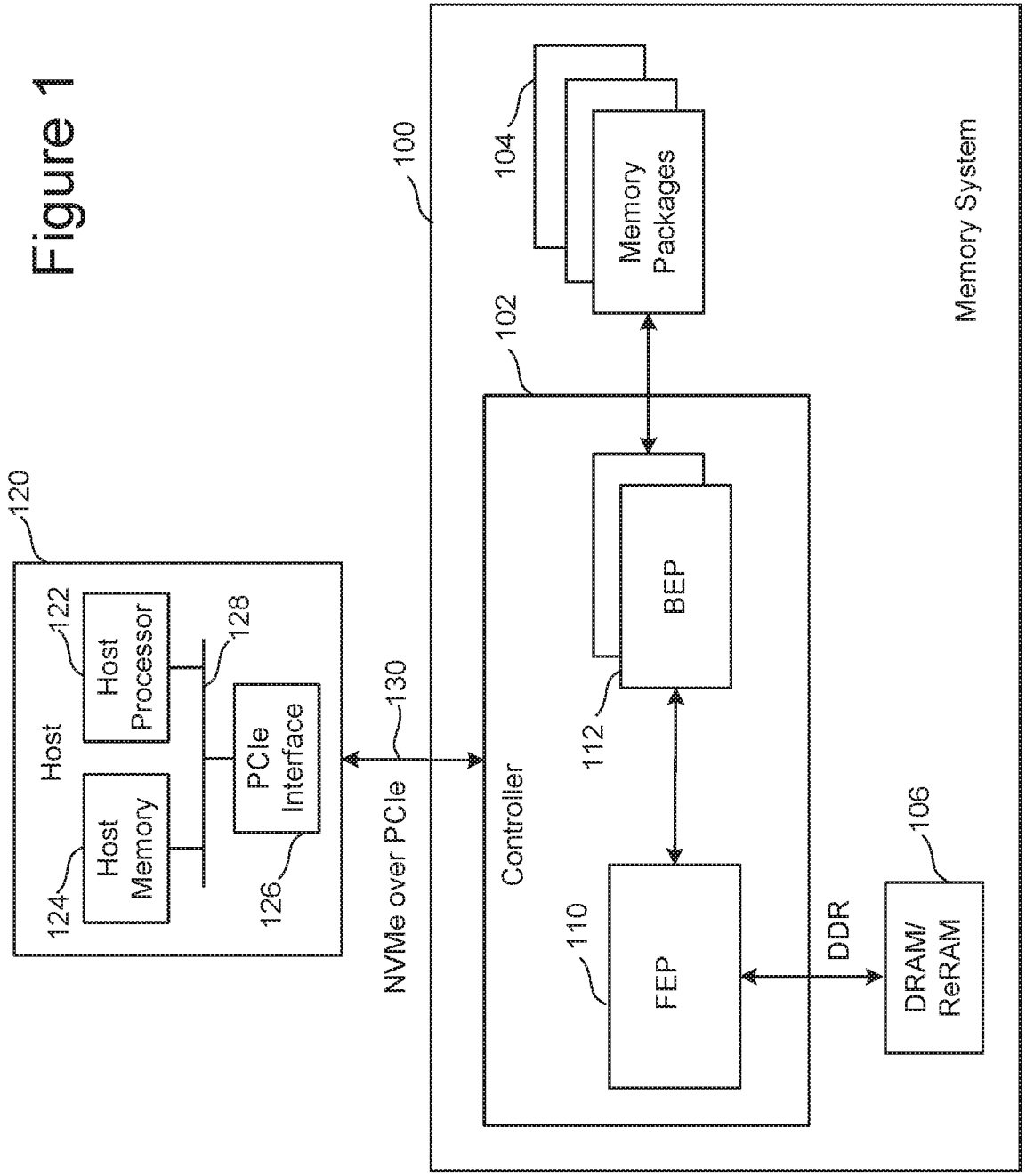
FIG. 1 is a block diagram of one embodiment of a memory system connected to a host.

FIG. 1 is a block diagram of one embodiment of a memory system 100 connected to a host 120. Memory system 100 can implement the technology proposed herein, where data are received from and transferred to the host 120. Depending on the embodiment, the inputs can be received from the host 120 and then provided to the memory packages 104 for inferencing on the weights previously programmed into the memory arrays of the memory packages 104. Many different types of memory systems can be used with the technology proposed herein. Example memory systems include solid state drives ("SSDs"), memory cards and embedded memory devices; however, other types of memory systems can also be used.

Memory system 100 of FIG. 1 comprises a Controller 102, non-volatile memory 104 for storing data, and local memory (e.g. DRAM/ReRAM) 106. Controller 102 comprises a Front End Processor (FEP) circuit 110 and one or more Back End Processor (BEP) circuits 112. In one embodiment FEP circuit 110 is implemented on an ASIC. In one embodiment, each BEP circuit 112 is implemented on a separate ASIC. In other embodiments, a unified controller ASIC can combine both the front end and back end functions. The ASICs for each of the BEP circuits 112 and the FEP circuit 110 are implemented on the same semiconductor such that the Controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, non-volatile memory 104 comprises a plurality of memory packages. Each memory package includes one or more memory die. Therefore, Controller 102 is connected to one or more non-volatile memory die. In one embodiment, each memory die in the memory packages 104 utilize NAND flash memory (including two dimensional NAND flash memory and/or three-dimensional NAND flash memory). In other embodiments, the memory package can include other types of memory.

Controller 102 communicates with host 120 via an interface 130 that implements NVM Express (NVMe) over PCI Express (PCIe). For working with memory system 100, host 120 includes a host processor 122, host memory 124, and a PCIe interface 126 connected along bus 128. Host memory 124 is the host's physical memory, and can be DRAM, SRAM, non-volatile memory or another type of storage. Host 120 is external to and separate from memory system 100. In one embodiment, memory system 100 is embedded in host 120.

Figure 2:
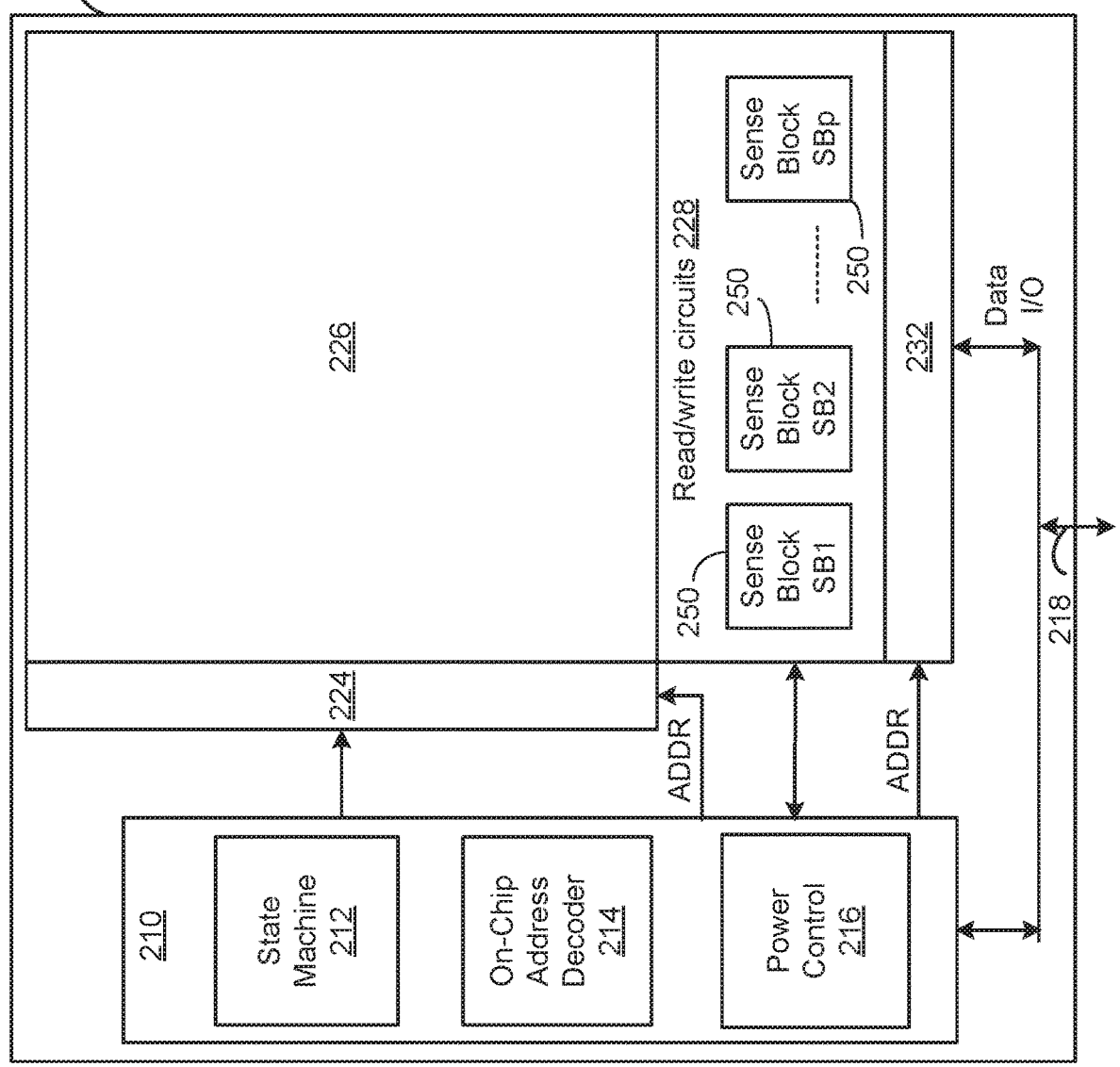
FIG. 2 is a block diagram of one embodiment of a memory die.

FIG. 2 is a functional block diagram of one embodiment of a memory die 200. The components depicted in FIG. 2 are electrical circuits. In one embodiment, each memory die 200 includes a memory structure 226, control circuitry 210, and read/write circuits 228. Memory structure 226 is addressable by word lines via a row decoder 224 and by bit lines via a column decoder 232. The read/write circuits 228 include multiple sense blocks 250 including SB1, SB2, . . . , SBp (sensing circuitry) and allow a page of memory cells to be read or programmed in parallel. Commands and data are transferred between the Controller and the memory die 200 via lines 218. In one embodiment, memory die 200 includes a set of input and/or output (I/O) pins that connect to lines 218.

Control circuitry 210 cooperates with the read/write circuits 228 to perform memory operations (e.g., write, read, and others) on memory structure 226, and includes a state machine 212, an on-chip address decoder 214, and a power control circuit 216. State machine 212 provides die-level control of memory operations. In one embodiment, state machine 212 is programmable by software. In other embodiments, state machine 212 does not use software and is completely implemented in hardware (e.g., electrical circuits). In another embodiment, state machine 212 is replaced by a micro-controller. In one embodiment, control circuitry 210 includes buffers such as registers, ROM fuses and other storage devices for storing default values such as base voltages and other parameters.

The on-chip address decoder 214 provides an address interface between addresses used by Controller 102 to the hardware address used by the decoders 224 and 232. Power control module 216 controls the power and voltages supplied to the word lines and bit lines during memory operations. Power control module 216 may include charge pumps for creating voltages. The sense blocks include bit line drivers.

For purposes of this document, the phrase "one or more control circuits" refers to a controller, a state machine, a micro-controller and/or control circuitry 210, or other analogous circuits that are used to control non-volatile memory.

In one embodiment, memory structure 226 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping material such as described, for example, in U.S. Pat. No. 9,721,662, incorporated herein by reference in its entirety.

In another embodiment, memory structure 226 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 226 is not limited to the examples above. Many different types of memory array architectures or memory technologies can be used to form memory structure 226. No particular non-volatile memory technology is required for purposes of the new claimed embodiments proposed herein. Other examples of suitable technologies for memory cells of the memory structure 226 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 126 include two dimensional arrays, three-dimensional arrays, cross-point arrays, stacked two dimensional arrays, vertical bit line arrays, and the like.

One example of a ReRAM is a cross point memory that includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

As noted above, the memory structure 226 is typically structured as an array of memory cells formed along word lines and bit lines, where the word lines are addressable via a row decoder 224 and bit lines are addressable via a column decoder 232. To sense the state of the memory cells, the bit lines are connected to the read/write circuits 228 that include the multiple sense blocks 250 including SB1, SB2, SBp (sensing circuitry), allowing a page of memory cells to be read or programmed in parallel.

Figure 3:
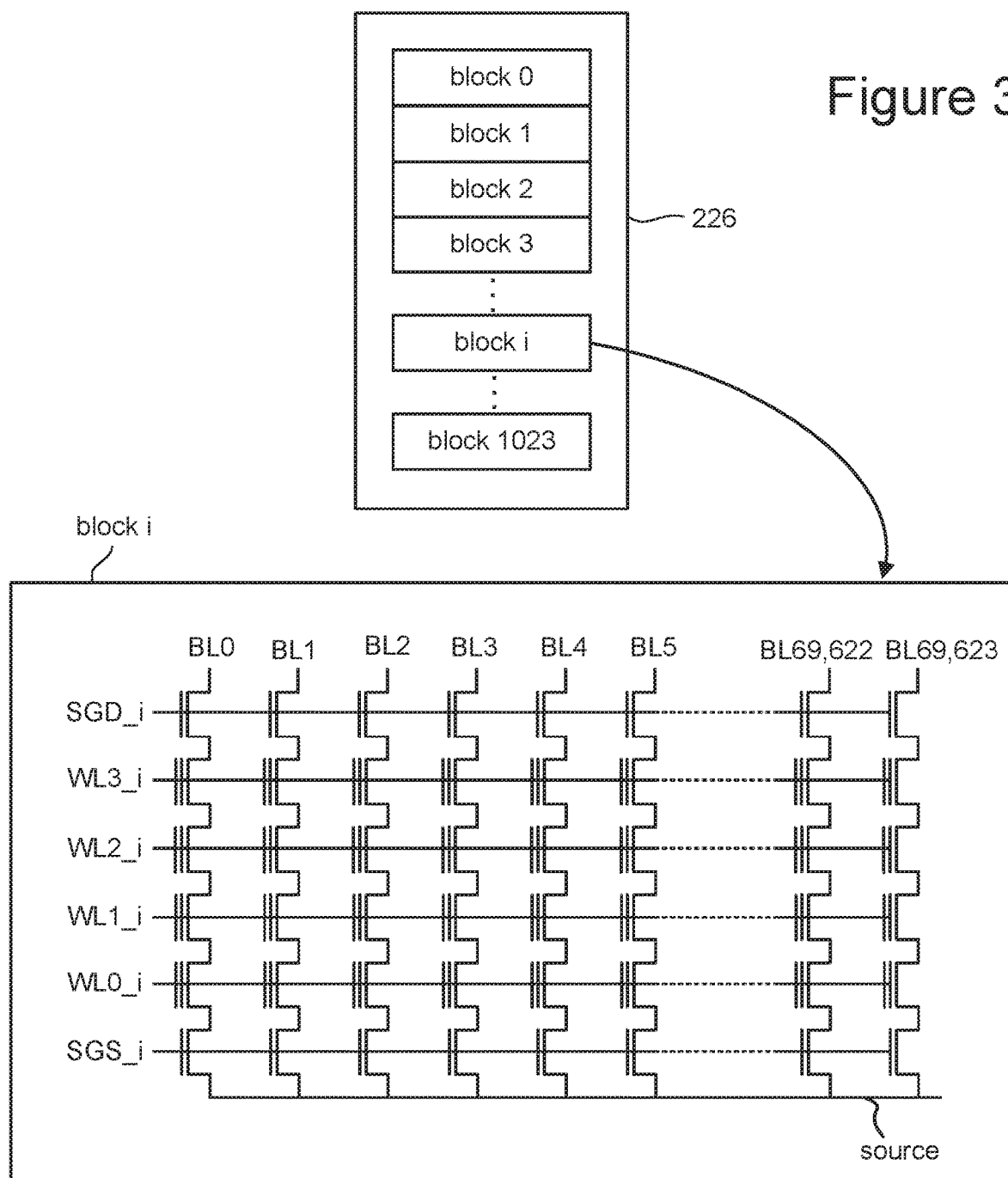
FIG. 3 depicts an example of a structure of memory cell array to illustrate an arrangement of memory cells along word lines and bit line.

FIG. 3 depicts an example of a structure of memory cell array 226 to illustrate an arrangement of memory cells along word lines and bit line. The example of FIG. 3 is for flash NAND type of memory, which can be either a two-dimensional or three-dimensional architecture. In one embodiment, the array of memory cells is divided into a large number of blocks (e.g., blocks 0-1023, or another amount) of memory cells. As is common for flash EEPROM systems, the block is the unit of erase. That is, each block contains the minimum number of memory cells that are erased together. Other units of erase can also be used.

A block contains a set of NAND stings which are accessed via bit lines (e.g., bit lines BL0-BL69, 623) and word lines (WL0, WL1, WL2, WL3). FIG. 3 shows four memory cells connected in series to form a NAND string. Although four cells are depicted to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

Each block is typically divided into a number of pages. In one embodiment, a page is a unit of programming and a unit of reading, where the read page and the write page are often taken to be of the same size, different pages sizes can be used for the different operations. Other units of programming and reading can also be used. One or more pages of data are typically stored in one row of memory cells. For example, one or more pages of data may be stored in memory cells connected to a common word line. A page can store one or more sectors. A sector includes user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages and sectors can also be used.

Besides NAND flash memory, other memory technologies and architectures, including PCM, MRAM, and others discussed above, can be used for the for the memory structure 226. Generally, however, they will be arranged along bit lines and word lines and/or other control lines. For any of these structures, when the memory cells are being sensed, this is typically done by considering a voltage level or current level on a memory cell's bit line in response to bias levels applied to the memory cell by the word lines and/or other control lines, where the sensing is performed by the Sense Blocks 250.

Figure 4:
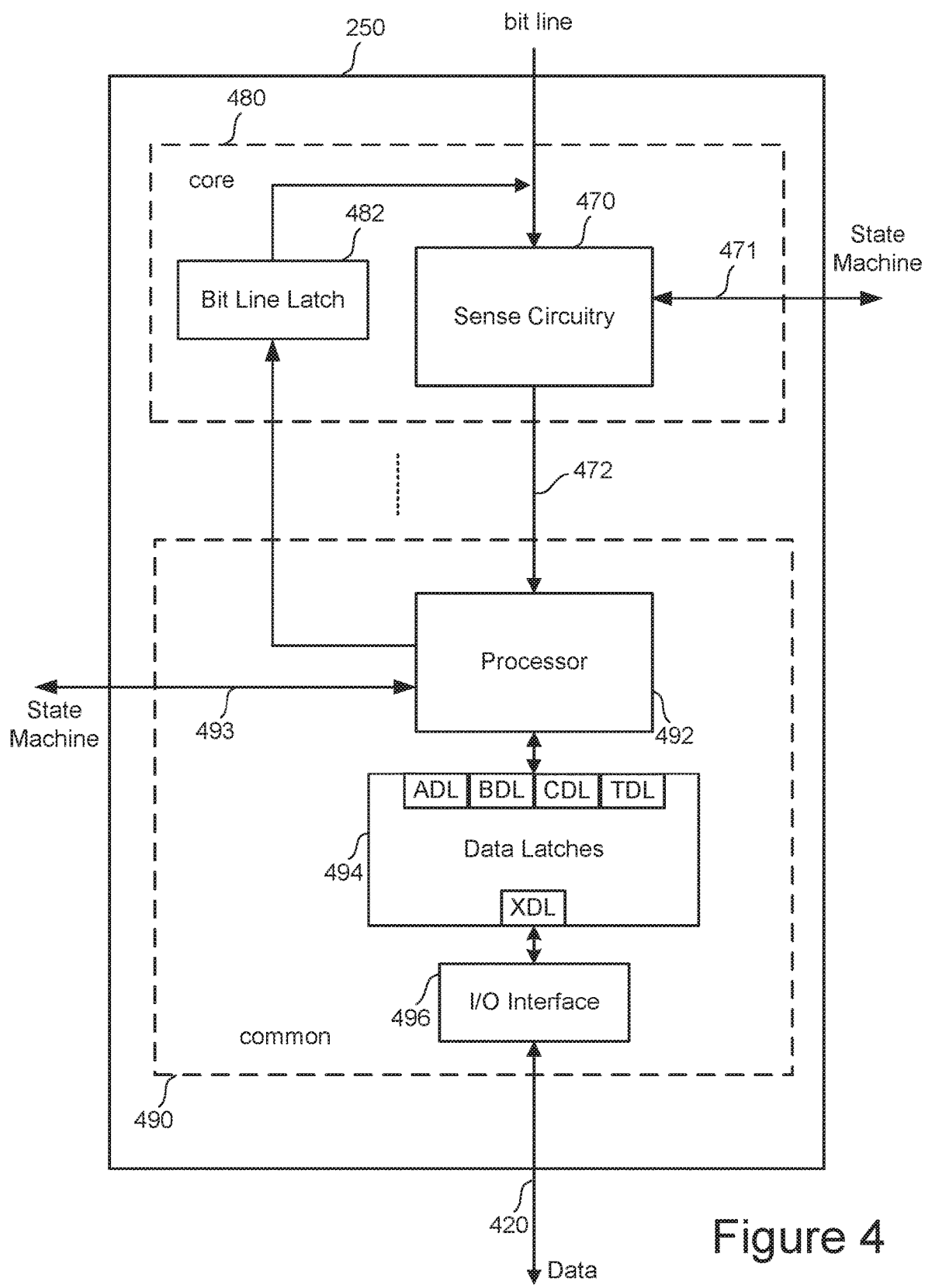
FIG. 4 is a block diagram of an individual sense block partitioned into a core portion and a common portion.

FIG. 4 is a block diagram of an individual sense block 250 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense or sixteen modules 480. Each of the sense modules in a group will communicate with the associated common portion via a data bus 472.

Sense module 480 comprises sense circuitry 470 that determines whether a conduction current in a connected bit line is above or below a predetermined level or, in voltage based sensing, whether a voltage level in a connected bit line is above or below a predetermined level. The sense circuitry 470 is to received control signals from the state machine via input lines 471. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 212 that controls (using power control 216) the supply of different control gate or other bias voltages to the addressed memory cell(s). As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

Data latch stack 494 contains a stack of data latches corresponding to the sense module. In one embodiment, there are three, four or another number of data latches per sense module 480. In one embodiment, the latches are each one bit. In this document, the latches in one embodiment of data latch stack 494 will be referred to as XDL, ADL, BDL, and CDL. In the embodiments discussed here, the latch XDL is a transfer latch used to exchange data with the I/O interface 496. The latches ADL, BDL and CDL can be used to hold multi-state data, where the number of such latches typically reflects the number of bits stored in a memory cell. For example, in 3-bit per cell multi-level cell (MLC) memory format, the three sets of latches ADL, BDL, CDL can be used for upper, middle, lower page data. In 2-bit per cell embodiment, only ADL and BDL might be used, while a 4-bit per cell MLC embodiment might include a further set of DDL latches. The following discussion will mainly focus on a 3-bit per cell embodiment, as this can illustrate the main features but not get overly complicated, but the discussion can also be applied to embodiments with more or fewer bit per cell formats. Some embodiments many also include additional latches for particular functions, such as represented by the TDL latch where, for example, this could be used in "quick pass write" operations where it is used in program operations for when a memory cell is approaching its target state and is partially inhibited to slow its programming rate. In embodiments discussed below, the latches ADL, BDL, . . . can transfer data between themselves and the bit line latch 482 and with the transfer latch XDL, but not directly with the I/O interface 496, so that a transfer from these latches to the I/O interface is transferred by way of the XDL latches.

For example, in some embodiments data read from a memory cell or data to be programmed into a memory cell will first be stored in XDL. In case the data is to be programmed into a memory cell, the system can program the data into the memory cell from XDL. In one embodiment, the data is programmed into the memory cell entirely from XDL before the next operation proceeds. In other embodiments, as the system begins to program a memory cell through XDL, the system also transfers the data stored in XDL into ADL in order to reset XDL. Before data is transferred from XDL into ADL, the data kept in ADL is transferred to BDL, flushing out whatever data (if any) is being kept in BDL, and similarly for BDL and CDL. Once data has been transferred from XDL into ADL, the system continues (if necessary) to program the memory cell through ADL, while simultaneously loading the data to be programmed into a memory cell on the next word line into XDL, which has been reset. By performing the data load and programming operations simultaneously, the system can save time and thus perform a sequence of such operations faster.

During program or verify, the data to be programmed is stored in the set of data latches 494 from the data bus 420. During the verify process, Processor 492 monitors the verified memory state relative to the desired memory state. When the two are in agreement, processor 492 sets the bit line latch 482 so as to cause the bit line to be pulled to a state designating program inhibit. This inhibits the memory cell coupled to the bit line from further programming even if it is subjected to programming pulses on its control gate. In other embodiments the processor initially loads the bit line latch 482 and the sense circuitry sets it to an inhibit value during the verify process.

In some implementations (but not required), the data latches are implemented as a shift register so that the parallel data stored therein is converted to serial data for data bus 420, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 5:
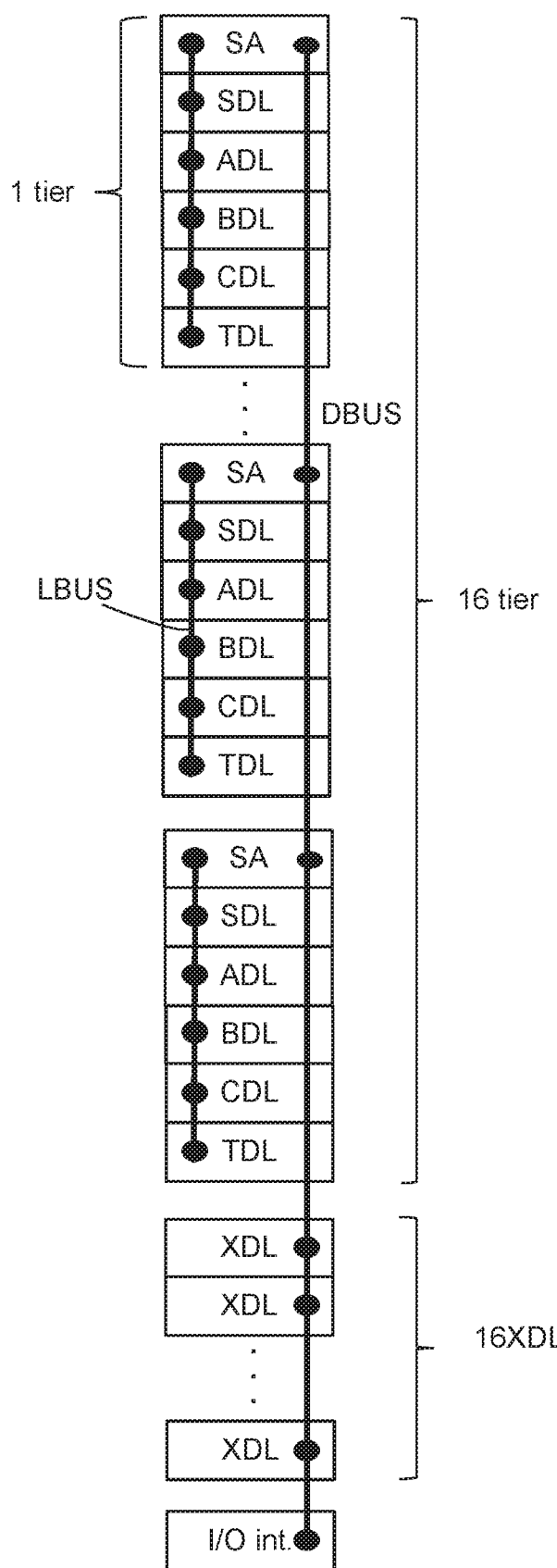
FIG. 5 is a schematic representation of one embodiment for the structure of the data latches.

FIG. 5 is a schematic representation of the structure for one embodiment of the data latches. The example of FIG. 5 is for a 3 bit per cell embodiment where each sense amplifier (SA) has a set of associated data latches forming a "tier" including a sense amp data latch (SDL), the data latches for the 3 bit data states (ADL, BDL, CDL), and an auxiliary data latch (TDL) that could be used for implemented quick pass write operations, for example. Within each of these stacks of data latches, data can be transferred between the sense amplifier and its associated set of latches along a local bus LBUS. In some embodiments, each of the sense amplifiers and corresponding set of data latches of a tier that are associated with one bit line can be grouped together for a corresponding "column" of bit lines, and formed on a memory die within the pitch of the column of memory cells along the periphery of the memory cell array. The example discussed here uses an embodiment where 16 bit lines form a column so that a 16-bit word is physical located together in the array. An example of a memory array may have a 1000 such columns, corresponding to 16K bit lines. Each sense amplifier and its set of associated data latches of a tier are connected along an internal bus structure of DBUSs along which data can be transferred between each of the tier of latches and a corresponding XDL. For the embodiment described in the following, the XDL transfer latches can transfer data to and from the I/O interface, but the other data latches of the tier (e.g., ADL) are not arranged to transfer data directly to or from the I/O interface and must go through the intermediary of the transfer data latch XDL.

Figure 6:
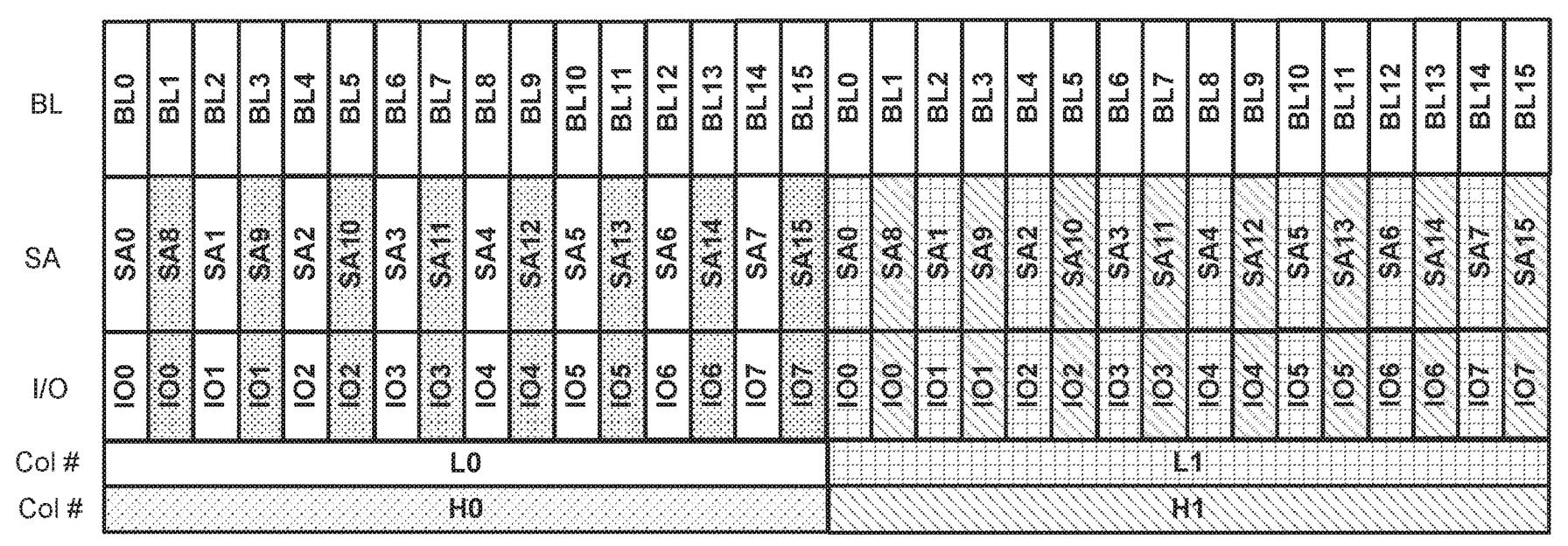

FIG. 6 illustrates the layout of the bit lines and sense amplifiers into columns in a schematic representation for two columns of 16 bit lines each. Each of column 0 and column 1 include bit lines BL0-BL15, so that a 16 bit word is grouped together on adjacent bit lines. Each bit line is connected to a corresponding one of sense amplifiers SA0-SA15. As the width of a sense amplifier circuit and the data latches is wider that the pitch of a bit line, rather than be aligned as in the schematic representation of FIG. 6 in the width of single bit line, the sense amps can be placed within the width of the column. In the embodiment shown, the sense amps are grouped into a set of 8 sense amplifiers corresponding to a lower half column storing a lower half word of data (e.g., L0 for column 0) for each page and a set of 8 set amplifiers corresponding to an upper half column storing an upper half word of data (e.g., H0 for column 0) for each page, where these can then be interleaved as shown in FIG. 6. Each half column of sense amplifiers is connected to a corresponding I/O interface IO0-IO7 for the lower and upper half column. For example, on the left of FIG. 6 column L0 corresponds to the odd bit lines connected to SA0-SA7 through a first set of IO0-IO7; and L1 corresponds to the even bit lines connected to SA8-SA15 through a second set of IO0-IO7. The structure represented schematically in FIG. 6 would be repeated, for example, 16,000 times for the whole an array.

Figure 7:
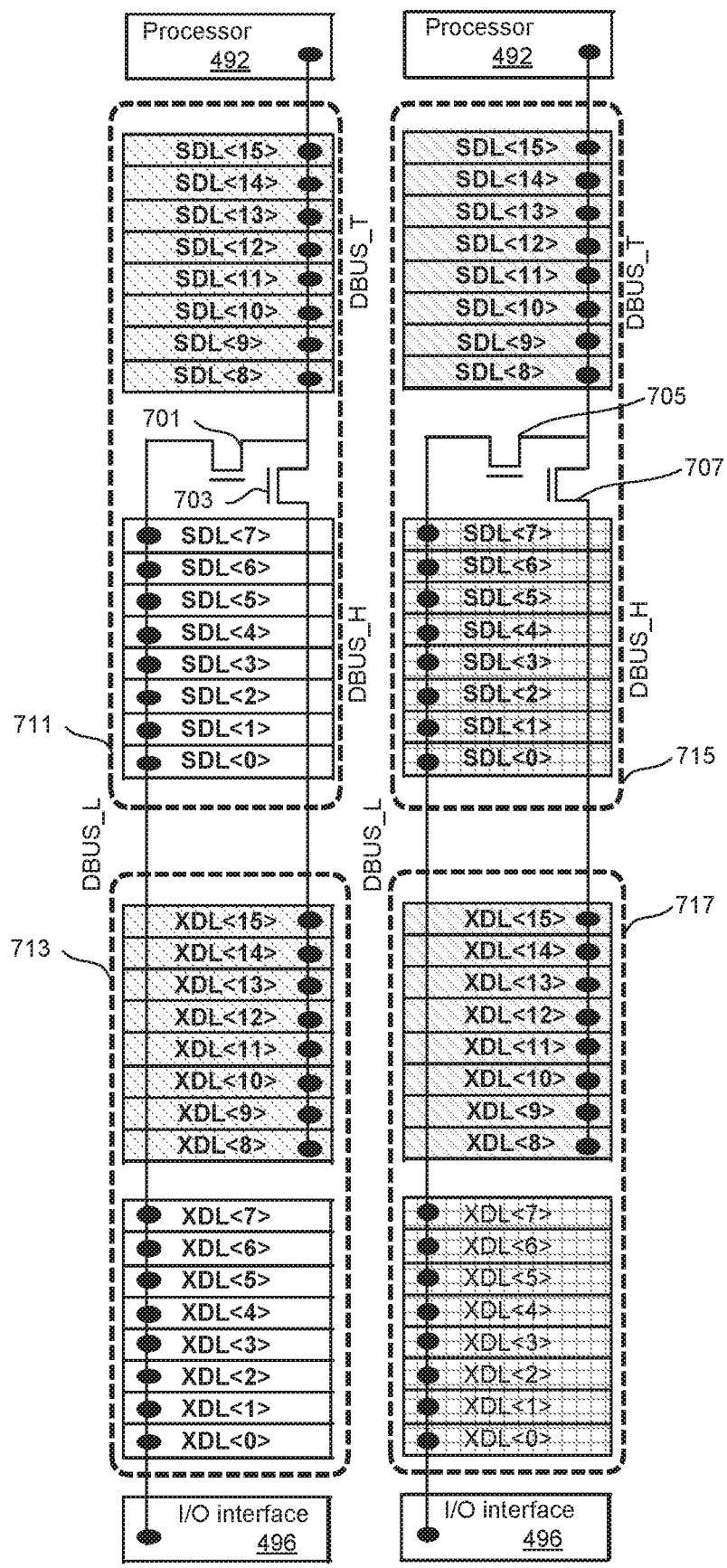
FIG. 7 shows more detail on an arrangement of the data latches for an embodiment where the column is split into an upper and a lower half-column as represented in FIG. 6.

FIG. 7 shows more detail on an arrangement of the data latches 494 of FIG. 4 for an embodiment where the column is split into an upper and a lower half-column as represented in FIG. 6 for the two columns of FIG. 6. In FIG. 6, for each bit line only the latch SDL is shown for a tier in order to simplify the figure, but for each shown SDL the other data latches (ADL, BDL, CDL, TDL) and sense amplifier of each bit line of the tier will also connected on the local bus LBUS, so that if all of these were explicitly represented there would a corresponding increase in the number of latches on each column.

The data latches 494 of column 0 are connected to the processor 492 by an internal bus structure, including a bus DBUS_T to the SDL latches SDL<0>-SDL<15> 711 (including the not explicitly represented latches ADL, BDL, CDL, TDL) for both the upper half-page H0 for sense amplifiers SA8-SA15 and the lower half-page L0 for sense amplifiers SA0-SA7. (The operation of the latch structure can be controlled by the state machine 212 or other control circuitry over the control lines 471 and 493 of FIG. 4.) The other columns, as illustrated to the right for column 1, are similarly arranged. A switch 701 allows DBUS_T to connect to another internal data bus DBUS_L of the internal bus structure and a switch 703 allows DBUS_T to connect to a connect to another internal data bus DBUS_H of the internal bus structure. In the embodiment of FIG. 7, the upper half columns latches SDL<8>-SDL<15> are connected to processor 492 along DBUS_T, while to connect the processor 492 to the lower half columns latches SDL<0>-SDL<7> the switch 701 is turned on and 703 is turned off, allowing data to be transferred between these lower half columns latches SDL<0>-SDL<7> to be transferred to and from the sense amplifier.

In the column 0 transfer latches 713, the transfer latches XDL<8>-XDL<15> are connected to the SDL<8>-SDL<15> over the DBUS_H by switch 703 to allow transfer between these latches. The transfer latches XDL<0>-XDL<7> are connected to the SDL<0>-SDL<7> over the DBUS_L, that is also connected on to the I/O interface 496 to allow transfers to and from the outer bus that is for the interface to a host. For column 1, the transfer latches 717 and sense amp tier latches 715 are arranged similarly through switches 705 and 707.

An important consideration for a memory die is capacity. The amount of data that can stored on a memory die of a given physical size depends on the number of memory cells on the die and the number of data states that can be stored in each of the memory cells. On a memory die, a major portion is given over to the memory cells (the memory structure 226 of FIG. 2), but some portion is also given over to the peripheral element illustrated in FIG. 2, where any area of a die given to the peripheral elements is not available for memory cells. If the area devoted to these peripheral elements can be reduced, the area for the available for data (and consequent data capacity) is increased.

The data latch structure described with respect to FIGS. 4-7 can take a not insignificant amount of real estate on a memory die. If this latch area can be reduced, the storage density of a die can be increased. One way to do this would be eliminate one of the latches ADL, BDL, CDL, TDL of a tier and then to use the XDL latch, which in the description above is used for transfers between the other data latches and the I/O interface, to also double for the eliminated latch. However, asking XDL to fulfill its transfer functions and also act as a data latch requires significant amounts of data shuffling between the different latches along the DBUSs of the write and write circuit's internal bus structure. This can delay operations and affect performance. The following presents an approach that reduces the number of transfer latches (XDLs) to reduce the area given over to the periphery circuitry on the die.

Figure 8:
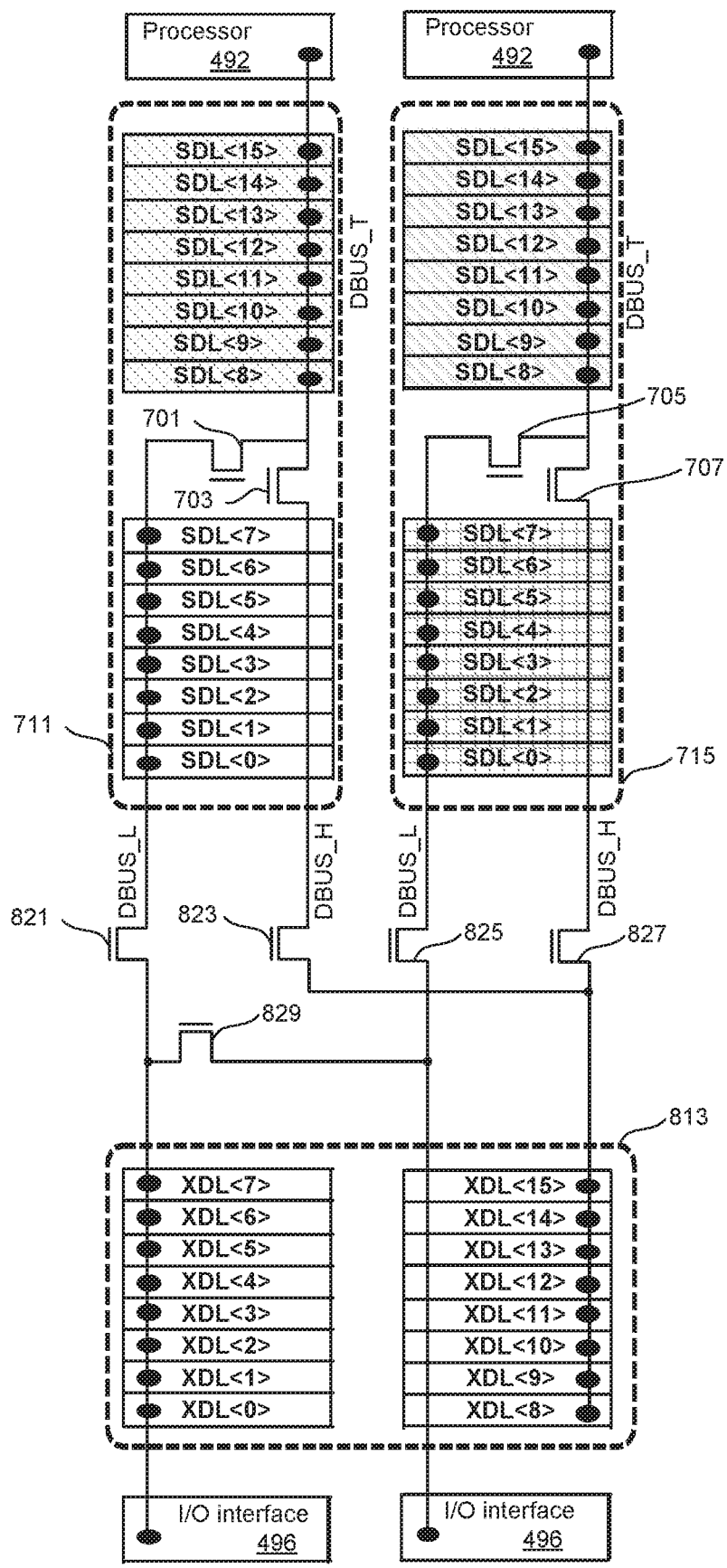
FIG. 8 illustrates an embodiment of the data latch structure with a reduced number of transfer latches.

More specifically, the following presents embodiment that reduce the data latch area by reducing the number of data transfer latches (XDLs), such as by half or a quarter, while having equivalent or better read and write performance relative to embodiments that reduce latch area by removing of one of the tier latches. FIG. 8 illustrates one embodiment.

FIG. 8 illustrates an embodiment of the data latch structure with a reduced number of transfer latches, where the number of XDLs is reduced by through sharing of XDLs between columns. FIG. 8 again shows two columns corresponding 16 bit lines each, repeating many of the elements of FIG. 7. Column 0 and column 1 again have respective sets of SDL latches SDL<0>-SDL<15> 711 and 715 (including the not explicitly represented latches ADL, BDL, CDL, TDL) connected along the busses DBUS_T, DBUS_H, and DBUS_L though switches 701, 703, 705 and 707. Relative to FIG. 7, however, FIG. 8 only includes one set of transfer data latches XDL<0>-XDL<15> 813 that is shared between the two columns. To allow for the selective internal transfers between XDL<0>-XDL<15> 813 the SDL latches of both column 0 711 and column 1 715, a set of switches 821, 823, 825, 827 and 829 are introduced, allowing for SDL<0>-SDL<7> to be connected to XDL<0>-XDL<7> for both columns and for SDL<8>-SDL<15> to be connected to XDL<8>-XDL<15> for both columns. As described in the following, the transfer of data between the SDL latches 711, 715 of each column and the shared XDL latches 813 is performed sequentially.

The embodiment of FIG. 8 consequently reduces the number of the XDL transfer latches by a factor of 2, saving on die area for these peripheral elements and freeing up this space for the memory array structure. Although the following discussion is mainly presented in the context of the embodiment of FIG. 8, other embodiments can further reduce the die area used by the XDL latches by using a higher degree of transfer latch sharing by the columns. For example, by having four columns share one set of XDL latches, the area used for these latches can be reduced by a factor of four.

Comparing the arrangement of FIG. 7 and FIG. 8, as described in the following, the transfer of data between the SDL latches 711, 715 each column and the shared XDL latches 813 is performed sequentially, resulting in more frequent transfers on the DBUS_L and DBUS_H structures. Although in some circumstances this might affect performance, the additional transfer time can sometimes be hidden behind other operations. Another consequence is that if the shared block of XDL latches 813 is defective, this may affect operations in both columns. Additionally, in some embodiments the sharing of XDL latches between multiple columns may alter the way in which defective columns are treated.

A column of a memory device can be defective for a number of reasons, including defective memory cells along the columns bit lines, shorts or breaks in the bit lines, and defects in peripheral circuitry (such as sense amplifiers or data latches) associated with the column. Such defects can be due to processing and be present when a device is fresh or arise during operation of the device, both due to weaknesses in a fresh device and due to wear over the life of a device. To be able to manage such defects, a memory device will often include redundant columns, not accounted for in the available space for user data, but which can be substituted in to replace bad columns. For example, if a memory device has a user data capacity 16K columns, which will correspond to the amount of logical memory space as seen be a host device, the memory device will also have some amount of space for error correction code (ECC) associated with the user data and also some amount of space for redundant columns (CRD), so the actual size of the memory is 16K+CRD+ECC.

Figure 9A:
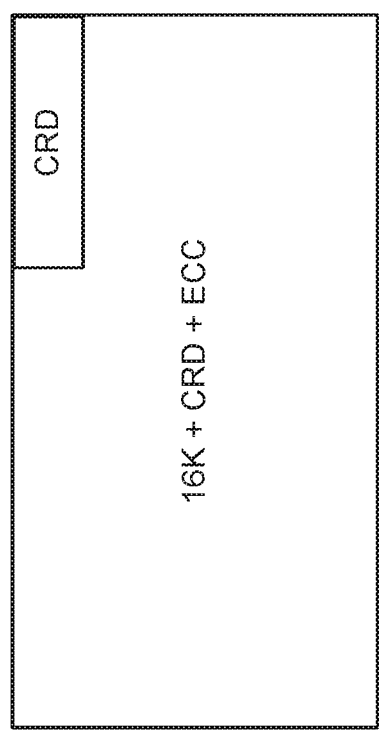
FIG. 9A is a logical image of the memory space, including the column redundancy portion, of a memory device.

FIG. 9A is a logical image of the memory space, including the column redundancy (CRD) portion, of a memory device, again for the example with a user data capacity of 16K columns. As any columns set aside for the CRD portion are lost capacity for user data, the size of the CRD portion is a design decision based a trade-off between user capacity and device resilience. As illustrated schematically, the CRD columns will available for replacing bad columns across the whole of the array. As described above with respect to FIG. 8, when a set of XDL latches is shared between two columns, the shared XDL latches 813 are accessible only by either column 0 or column 1 at any given time. More generally, under this shared transfer latch structure, only half the columns can access data transfer latches at a time so that, for example, only either odd or even columns would have XDL access. Because of this, if the CRD columns are located in just one half of the columns, they may not be readily available to replace bad columns in the other half. To account for this, FIG. 9B illustrates the use of embodiments where the CRD area is split, with a portion in each of subset of columns.

Figure 9B:
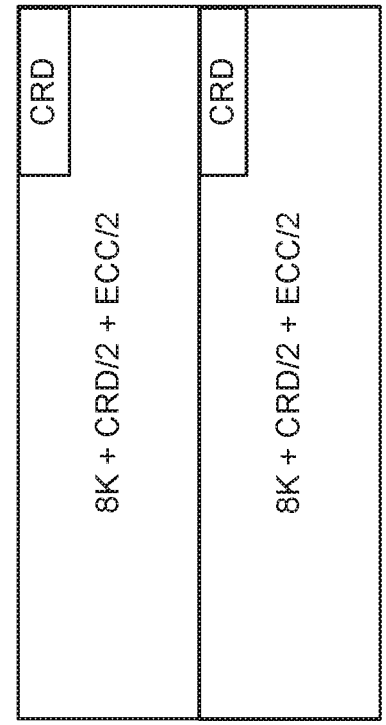
FIG. 9B is a logical image of the memory space of a memory device with the column redundancy portion split between two halves of the logical image.

FIG. 9B is a schematic representation of the logical image of the memory space of a memory device with the column redundancy portion split between two halves of the logical image, with each half of the memory space (i.e., even columns, odd columns) receiving half of the CRD allotment. By restricting half of the CRD to half the memory space, any replacement columns will fall within the same half-space boundary as the columns that they replace. If the size of CRD is marginal, the CRD size may be increased in case a memory is prone to clustering of bad columns; but in many memory devices, defective columns tend to be fairly uniformly distributed across the device and the CRD size will not need to increase.

Figure 10:
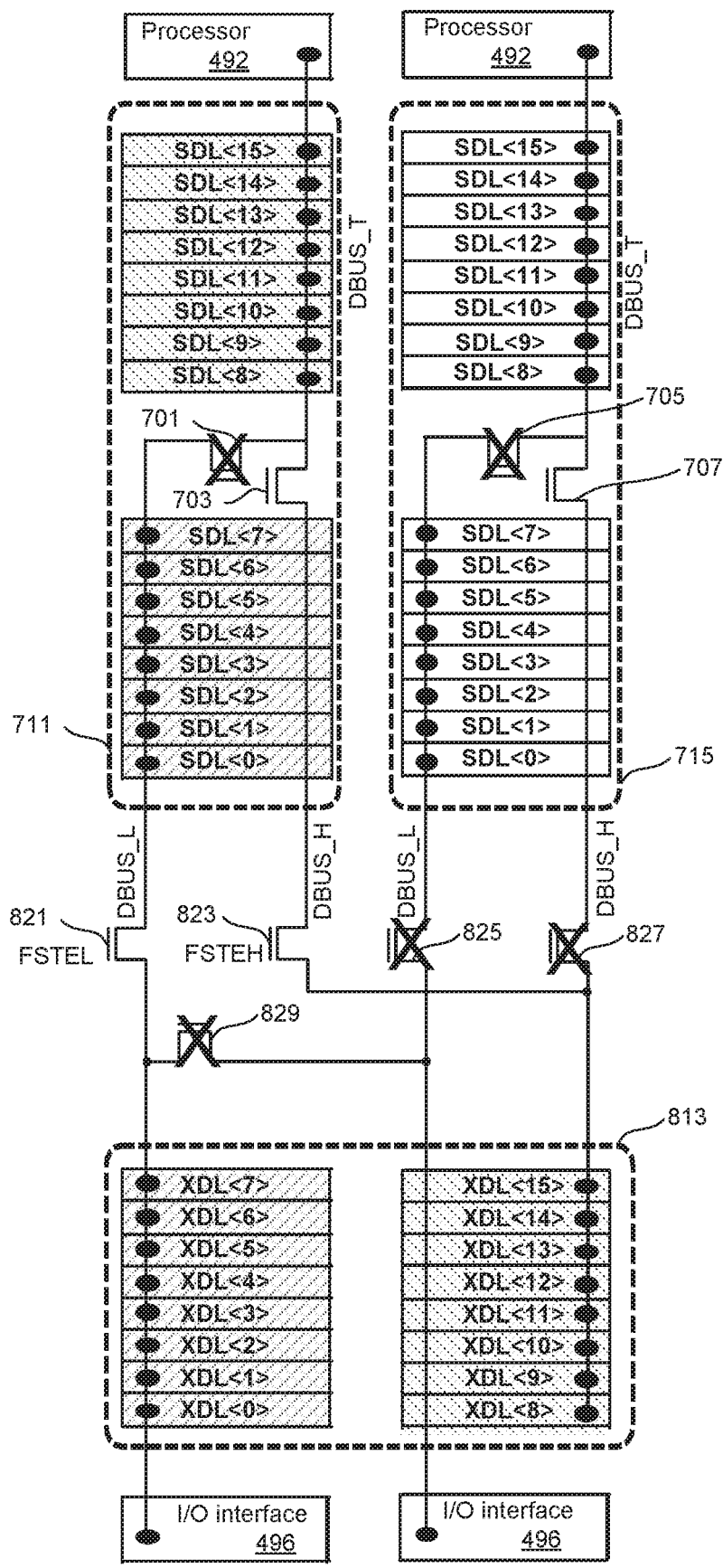
FIGS. 10 and 11 respectively illustrate the transfer between the sense amplifier latches and the shared transfer latches for even columns and odd columns.
Figure 11:
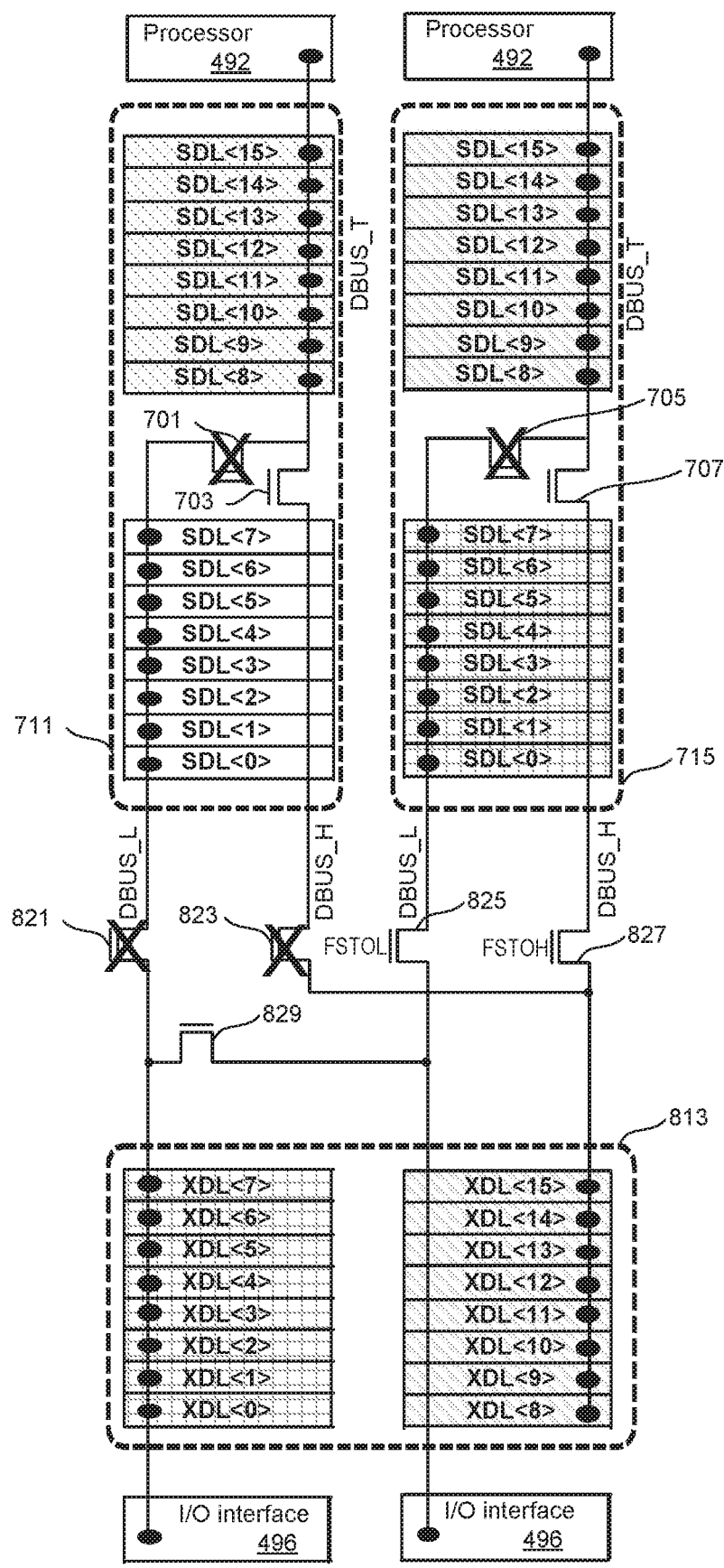

Returning now to the transfer of data between the SDL latches the XDL latches, FIGS. 10 and 11 repeat the elements of FIG. 8 and respectively illustrate the transfer between the SDL latches and the shared XDL latches for column 0 and column 1, or, more generally, even columns and odd columns. These transfers can be for the transfer from the XDL latches 813 to either the SDL latches 711 or 715 for the transfer of data for a program operation, or for the transfer from either the SDL latches 711 or 715 to XDL latches 813 the for the transfer of data for a read operation.

FIG. 10 illustrates the transfer of data between the column 0 SDL latches 711 and the XDL latches 813. To cut off the SDL latches 715 of column 1 from the shared XDL latches, switches 825, 827 and 829 are turned off, as indicated by an X on FIGS. 10 and 11. Switch 821 is turned on to connect the lower sense amplifier latches SDL<0>-SDL<7> of 711 to XDL<0>-XDL<7> of 813 in response to an even column lower first transfer (FSTEL) control signal (such as from the state machine 212) for transfer of the half-word L0, and switch 823 is turned on to connect the upper sense amplifier latches SDL<8>-SDL<15> of 711 to XDL<8>-XDL<15> of 813 in response to an even column upper first transfer (FSTEH) control signal for transfer of the half-word H0. The switches 705 and 701 can also be turned off for the transfers of both FIGS. 10 and 11 as the latches SDL<0>-SDL<7> are only to be connected to XDL<0>-XDL<7> and the latches SDL<8>-SDL<15> are only to be connected to XDL<8>-XDL<15> in both cases.

FIG. 11 illustrates the transfer of data between the column 1 SDL latches 715 and the XDL latches 813. To cut off the SDL latches 711 of column 0 from the shared XDL latches, switches 821 and 823 are turned off, as again indicated by an X. Switch 829 is turned on as is switch 825 to connect the lower sense amplifier latches SDL<0>-SDL<7> of 715 to XDL<0>-XDL<7> of 813 in response to an odd column lower first transfer (FSTOL) control signal for transfer of the half-word L1, and switch 827 is turned on to connect the upper sense amplifier latches SDL<8>-SDL<15> of 715 to XDL<8>-XDL<15> of 813 in response to an odd column upper first transfer (FSTOH) control signal for transfer of the half-word H0. Although the column 0 transfers are here described as preceding the column 1 transfers, the column 0 and column 1 transfers (or, more generally, even and odd column transfers) can be done in either order.

Figure 12:
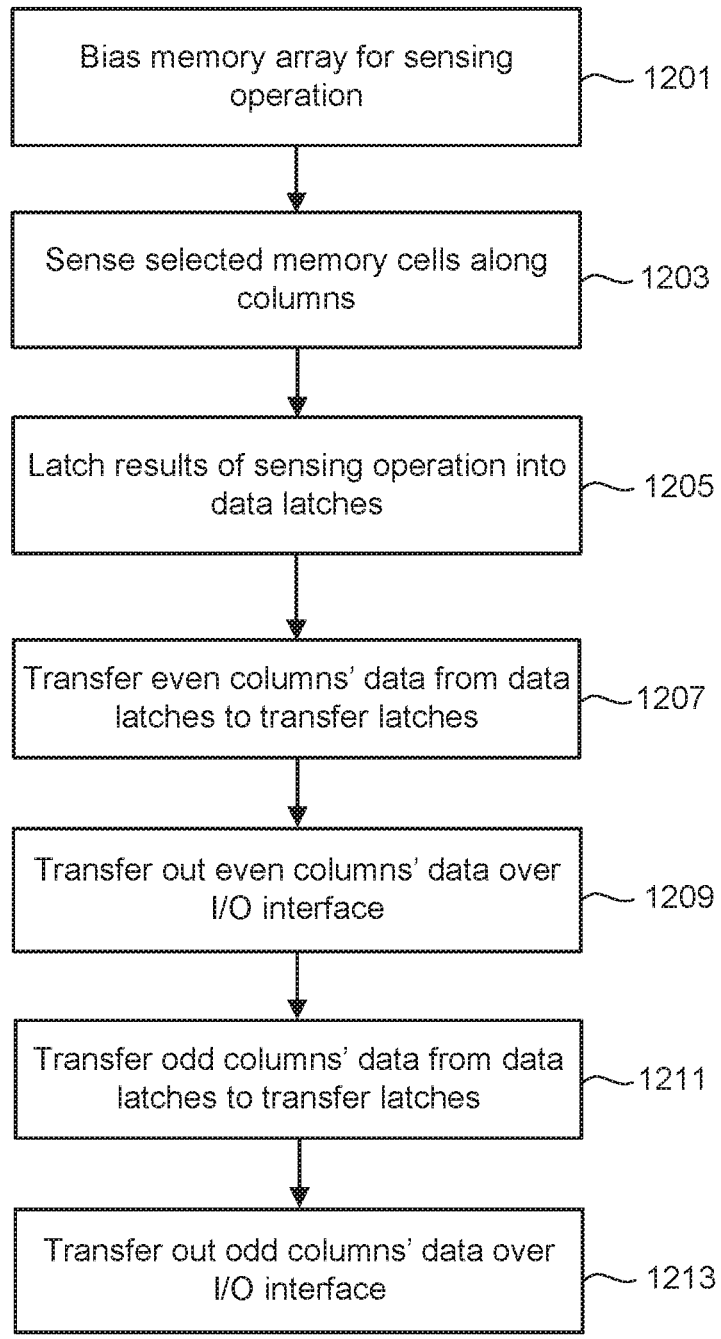
FIG. 12 is a flowchart of one embodiment for a read process using shared transfer data latches for memory array columns.

FIG. 12 is a flowchart of one embodiment for a read process using shared transfer data latches for memory array columns, where reference is made to the embodiment of FIGS. 10 and 11 and also FIG. 4. At step 1201 the memory array or structure 226 is biased for a read operation of selected memory cells. Typically, the selected memory cells will correspond to a selected word line in the array. The selected memory cells are sensed at step 1203 by the sense circuits 470, with the results latched in the data latches 494 at step 1205. For the even columns, such as column 0, this corresponds to the data latches SDL<0>-SDL<15> 711, and for the odd columns, such as column 1, this corresponds to the data latches SDL<0>-SDL<15> 715. As discussed above, each of the latches SDL of FIGS. 7, 8, 10, and 11 corresponds, in the embodiment of FIG. 5, to the multiple latches SDL, ADL, BDL, CDL and TDL, where the combination of latches can be used to perform multi-state sensing operations.

At step 1207, the data latched in the even column SDL latches 711 are shifted into the XDL latches 813 as described with respect to FIG. 10, followed by the odd column SDL latches at step 1211. From the transfer latches 813 the data can then be transferred to the I/O interface 496, from which it can be further transferred on to the memory system's controller and the host. At step 1211, the data latched in the odd column SDL latches 715 are shifted into the XDL latches 813 as described with respect to FIG. 11. From the transfer latches 813 the data can then be transferred to the I/O interface 496, from which it can be further transferred on to the memory system's controller and the host. In other embodiments, steps 1207 and 1209 can be switched with steps 1211 and 1213 if the odd columns are read out prior to the even columns. For multi-state sensing results, the values of the different latches in SDL (ADL, BDL, . . . ) can be transferred out sequentially from one set of columns then the other, or the different bits from the two set of columns can be interleaved. For embodiments where more than two columns share a common set of XDL latches, such as four columns sharing a common set of XDLs, the process of steps (1207, 1209) and (1211, 1213) would be repeated for each of the sub-sets of columns sharing a set or transfer latches.

Figure 13:
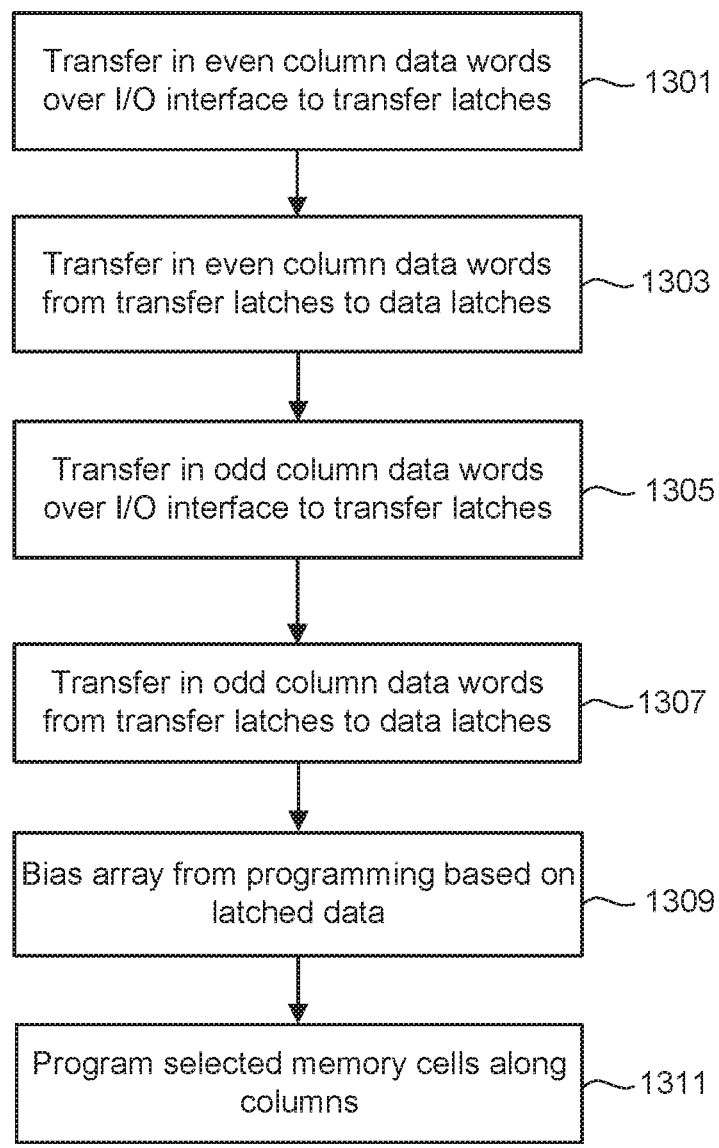
FIG. 13 is a flowchart of one embodiment for a write process using shared transfer data latches for memory array columns.

FIG. 13 is a flowchart of one embodiment for a write process using shared transfer data latches for memory array columns, where reference is again made to the embodiment of FIGS. 10 and 11 and also FIG. 4. Beginning at step 1301, words of data to be programmed into the even columns in transferred in over the I/O interface 496 to the XDL latches 813. The even column write data is then transferred from the XDL latches 813 to the even column SDL latches 711 at step 1203 as illustrated with respect to FIG. 10. The process is repeated for the odd columns at step 1305, with the words of odd column write data transferred in over the I/O interface 496 to the XDL latches 813, and at step 1307, with the odd column write being transferred to the odd column SDL latches 715 at step 1203 as illustrated with respect to FIG. 11. In other embodiments, steps 1301 and 1303 can be switched with steps 1305 and 1207 if the odd columns' write data are transferred in before the even column's write data.

For loading multi-bit write data, the values of the different latches in SDL (ADL, BDL, . . . ) can be transferred in sequentially from one set of columns then the other, or the different bits from the two set of columns can be interleaved, where after transfer to the SDL latches the different write words can be transferred to the various latches in 494 over the local latch bus LBUS as shown in FIG. 5. For embodiments where more than two columns share a common set of XDL latches, such as four columns sharing a common set of XDLs, the process of steps (1301, 1303) and (1305, 1307) would be repeated for each of the sub-sets of columns sharing a set or transfer latches.

Once the programming data has been loaded into the latches for all of the columns, the latched write data can be used for a programming operation at 1309. For example, based on the write data, the bit lines may be biased to a program inhibit or program enable level for a subsequent programming (e.g., application of a programming pulse for memory technologies that use such a programming mechanism) at step 1311. The latched data can also be used in program verify operations in some embodiments.

The embodiments described in FIGS. 12 and 13 include transfers for both even columns and odd columns; however, if a transfer is only being done for one of these, the steps related to other would not be part of the flow. In such a case, the read or program time for an embodiment based on FIG. 8 would be the same as for an embodiment based on FIG. 7. When data is being transferred for a read or write in all of the columns of die, such as in streaming data in or out of all of the columns on a die, the combined transfers between the SDL latches (711, 715) and the shared XDL latches (813) for combined steps 1207 and 1211 for a read and combined steps 1303 and 1307 will be same for the embodiment of FIG. 7; however the as steps 1209 and 1213 for the read and steps 1301 and 1305 are two separate transfers between the shared XDL latches 813 and the I/O interface 496, the time requirement of this subphase is doubled relative to when the embodiment of FIG. 7 is used.

Figure 14:
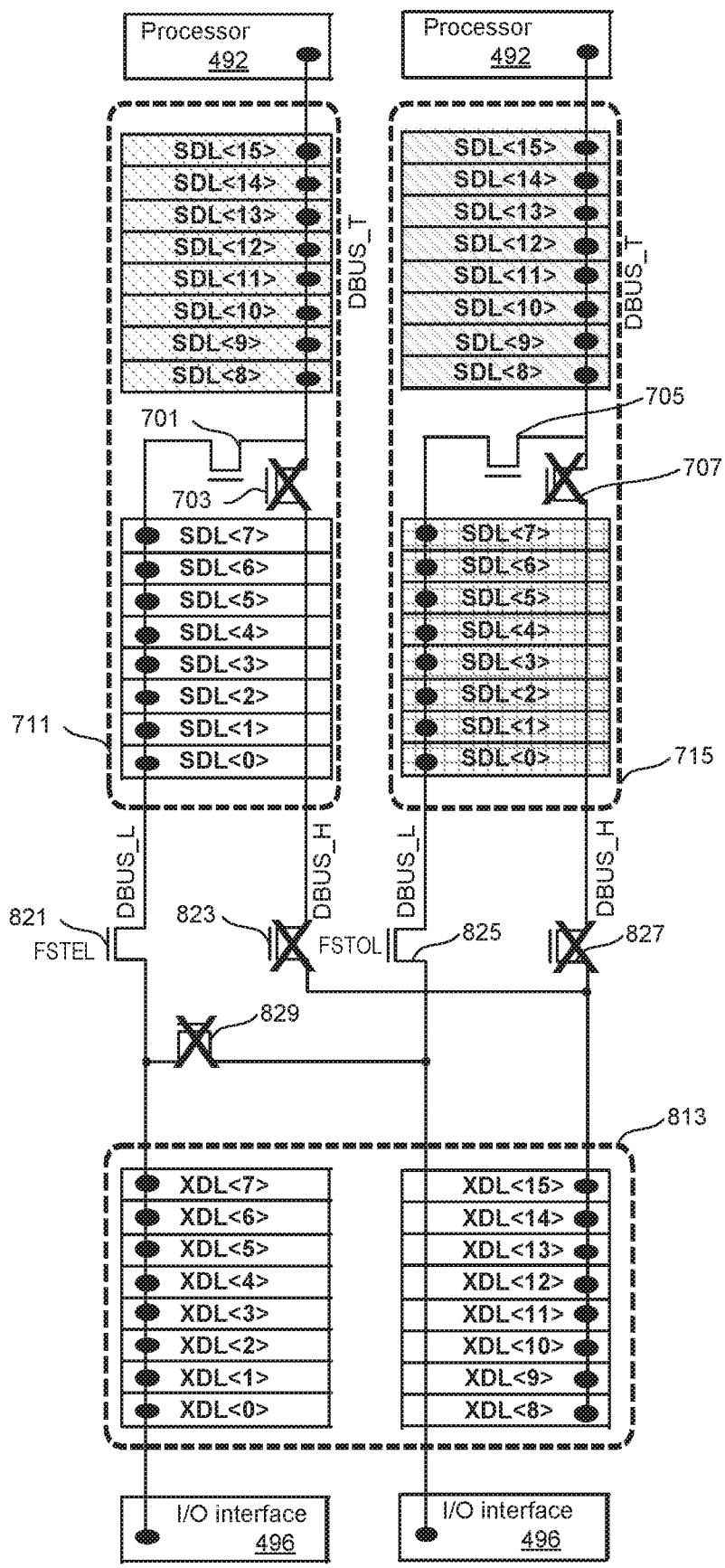
FIG. 14 illustrates the biasing of the switches of the sense amplifier's latch structure to independently connect the shared transfer latches to the sense amplifier latches of both the even and odd columns.

Returning to the handling of defective columns, as discussed above with respect to FIGS. 9A and 9B, embodiments of the memory devices here include techniques for the handling of defective columns. More specifically, the memory device can keep track of defective columns and replace these with redundant columns. In order to determine and tag bad columns, the memory needs to be able independently check and label the columns sharing a common set of transfer latches XDL 813. In both of transfer operations illustrated in FIGS. 10 and 11, the shared transfer latches XDL 813 are connected either to one column (column 0 in FIG. 10) or the other (column 1 in FIG. 11). FIG. 14 illustrates an embodiment for setting of the switches of FIG. 8 to be able to individually access both columns sharing a set of transfer latches XDL 813.

FIG. 14 illustrates the biasing of the switches independently connecting the shared transfer latches 813 to the sense amplifier latches SDL 711 of column 0 and the sense amplifier latches SDL 715 of column 1 715 for the detection and/or tagging of bad columns. To this end, the I/O interface 496 connected to XDL<0>-XDL<7> is only connected to the column 0 structure and the I/O interface 496 connected to XDL<8>-XDL<15> is only connected to the column 1 structure. This is effected by having the switches 823, 827, and 829 turned off, and having the switches 821 and 825 turned on. Additionally, the switches 703 and 707 are off, and switches 701 and 705 are on. This biasing of the switches allows the left (as represented in FIG. 14) I/O interface 496 to connect directly to the bit lines of column 0 and the right I/O interface 496 to connect directly to the bit lines of column 1, where this arrangement can be repeated for all of the even, odd column pairs. In this way, the memory system can check and tag bad columns through the shared XDL latch structure.

According to a first set of aspects, an apparatus includes an array of non-volatile memory cells, a data bus, read and write circuitry, and one or more control circuits. The memory cells are formed along a plurality of bit lines, the bit lines arranged as a plurality of N bit line columns, N being an integer greater than one. The read and write circuitry is connected to the columns and includes a plurality of sets of data latches, each set connected to a corresponding column and including one or more latches for each of the N bit lines of the corresponding column; and a first set of N transfer latches connected to multiple sets of data latches and connected to the data bus. The one or more control circuits are connected to the sets of data latches and the first set of transfer latches and configured to transfer data between the plurality of sets of data latches and the data bus. To transfer data between the plurality of sets of data latches and the data bus the one or more control circuits are configured to: transfer a first N bits of data between the data bus and the first set of N transfer latches, and between the first set N transfer latches and a first set of the sets of data latches; and subsequently transfer a second N bits of data between the data bus and the first set of transfer latches, and between the first set N transfer latches and a second set of the sets of data latches.

In additional aspects, a method includes concurrently sensing a plurality of selected memory cells each connected along a corresponding bit line, the bit lines arranged as a plurality of columns, including a first column and a second column, each column including a plurality of N bit lines. The method also includes latching sensing results for memory cells corresponding to the first column and the second column in a respective first set of data latches and a second set of data latches, each of the sets of data latches including one or more latches for each of the bit lines of the corresponding column. The sensing results latched in the first set of data latches are transferred to a data bus, including: transferring the sensing results latched in the first set of data latches to a shared set of N transfer latches; and subsequently transferring the sensing results from the shared set of transfer latches to the data bus. The sensing results latched in the first set of data latches are subsequently transferred to the data bus, including: transferring the sensing results latched in the second set of data latches to the shared set of transfer latches; and subsequently transferring the sensing results from the shared set of transfer latches to the data bus.

Further aspects include a method including receiving a first word of N bits of data, N being an integer greater than one and transferring the first word of data to a first set of data latches associated with a first column of a plurality of N bit lines and including one or more data latch for each of the bit lines, comprising: transferring the first word of data to a shared set of N transfer latches; and transferring the first word of data from the shared set of transfer latches to the first set of data latches. The method further includes receiving a second word of N bits of data and, subsequent to transferring the first word of data to the shared set of transfer latches, transferring the second word of data to a second set of data latches associated with a second column of a plurality of N bit lines and including one or more data latch for each of the bit lines, comprising: transferring the second word of data to the shared set of transfer latches; and transferring the second word of data from the shared set of transfer latches to the second set of data latches. The method also includes concurrently programming the first word of data and the second word of data as stored in the first set of data latches and the second set of data latches into selected memory cells connected to the bit lines for the first column and second column, respectively.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
    an array of non-volatile memory cells formed along a plurality of bit lines, the bit lines arranged as a plurality of N bit line columns, N being an integer greater than one;
    a data bus;
    read and write circuitry connected to the columns, comprising:
        a plurality of sets of data latches, each set connected to a corresponding column and including one or more latches for each of the N bit lines of the corresponding column; and
        a first set of N transfer latches connected to multiple sets of data latches and connected to the data bus, the first set of N transfer latches being connected to two sets of the data latches and configured to sequentially transfer data between the two sets of data latches and the data bus; and
    one or more control circuits connected to the sets of data latches and the first set of transfer latches and configured to transfer data between the plurality of sets of data latches and the data bus, where, to transfer data between the plurality of sets of data latches and the data bus to the one or more control circuits are configured to:
        transfer a first N bits of data between the data bus and the first set of N transfer latches, and between the first set N transfer latches and a first set of the sets of data latches; and
        subsequently transfer a second N bits of data between the data bus and the first set of transfer latches, and between the first set N transfer latches and a second set of the sets of data latches.

2. The apparatus of claim 1, wherein the read and write circuitry further comprises:
    a plurality of sense amplifiers, each of the sense amplifiers associated with one of the bit lines and the one or more data latches connected to the associated bit line.

3. The apparatus of claim 2, wherein the one or more control circuits are configured to:
    perform a sensing operation on a selected memory cell on each of the bit lines;
    latch a result of the sensing operation in a data latch associated with the corresponding bit line, and where when transferring data between the plurality of sets of data latches and the data bus, the one or more control circuits are configured to:
    transfer the first N bits of data from the first set of the sets of data latches to the first set N transfer latches, and from the first set N transfer latches to the data bus; and
    subsequently transfer the second N bits of data from the second set of the sets of data latches to the first set N transfer latches, and from the first set N transfer latches to the data bus.

4. The apparatus of claim 1, wherein the one or more control circuits are configured to:
    perform a write operation on a selected memory cell on each of the bit lines, wherein the one or more control circuits are configured to:
    transfer the first N bits of data from the data bus to the first set N transfer latches, and from the first set N transfer latches to the first set of the sets of data latches; and subsequently transfer the second N bits of data from the data bus to the first set N transfer latches, and from the first set N transfer latches to the second set of the sets of data latches.

5. The apparatus of claim 4, wherein the write operation is multi-state write operation and the set of data latches comprise a plurality of data latches for each of the N bit lines of the corresponding column, including a data latch for each column of each bit of multi-bit data to be programmed in the multi-state write operation.

6. The apparatus of claim 1, wherein the memory cells are configured to store data in a multi-bit format and the set of data latches comprise a plurality of data latches for each of the N bit lines of the corresponding column, including a data latch for each column of each bit of multi-bit data storable in the multi-bit format.

7. The apparatus of claim 1, wherein the bit lines of a column are a contiguous set of columns of the array of non-volatile memory cells, and the one or more control circuits are configured to store a word of on a column as a first half word and a second half word, the bit lines of the column storing the first half word being interleaved with the bit lines of the column storing the second half word.

8. The apparatus of claim 7, wherein the read and write circuitry further comprises:
an internal bus structure, the internal bus structure having a width of a half word of data, wherein the one or more control circuits are configured data between the sets of data latches and the first set of transfer latches a half word at a time.

9. The apparatus of claim 1, wherein in the read and write circuitry comprises:
a plurality of sets of N transfer latches, including the first set, each connected to a distinct corresponding plurality of the sets of data latches, connected to the data bus, and configured to transfer data the corresponding sets of data latches and the data bus.

10. The apparatus of claim 9, wherein:
the one or more control circuits are further configured to maintain a plurality of redundant columns in the array of non-volatile memory cells for replacement of defective columns, including maintaining a first subset of redundant columns associated with a first of the columns corresponding to each of the sets of transfer latches and a second, distinct subset of redundant columns associated with a second of the columns corresponding to each of the sets of transfer latches.

11. A method, comprising
concurrently sensing a plurality of selected memory cells each connected along a corresponding bit line, the bit lines arranged as a plurality of columns, including a first column and a second column, each column including a plurality of N bit lines;
latching sensing results for memory cells corresponding to the first column and the second column in a respective first set of data latches and a second set of data latches, each of the sets of data latches including one or more latches for each of the bit lines of the corresponding column;
transferring the sensing results latched in the first set of data latches to a data bus, comprising:
transferring the sensing results latched in the first set of data latches to a shared set of N transfer latches; and
subsequently transferring the sensing results from the shared set of transfer latches to the data bus; and
subsequently transferring the sensing results latched in the first set of data latches to the data bus, comprising:
transferring the sensing results latched in the second set of data latches to the shared set of transfer latches; and
subsequently transferring the sensing results from the shared set of transfer latches to the data bus.

12. The method of claim 11, wherein the sensing of the selected memory cells is a multi-state sensing operation and the first set of data latches and second set of data latches each include a plurality of latches for each of the bit lines of the corresponding column.

13. The method of claim 12, wherein:
transferring the sensing results latched in the first set of data latches to the data bus includes sequentially transferring the sensing results for bits of the multi-state sensing operation for the memory cells corresponding to the first column; and
transferring the sensing results latched in the second set of data latches to the data bus includes sequentially transferring the sensing results for bits of the multi-state sensing operation for the memory cells corresponding to the second column.

14. The method of claim 11, wherein:
the bit lines of a column are a contiguous set of columns of an array of memory cells, and a word of data is stored on the column as a first half word and a second half word, the bit lines of the column storing the first half word being interleaved with the bit lines of the column storing the second half word.

15. The method of claim 14, wherein the shared transfer latches are connected to the first set of data latches and to the second set of data latches over an internal bus structure having a width of a half word of data, and wherein:
transferring the sensing results latched in the first set of data latches to the shared set of transfer latches includes:
transferring a first half word of data from the first set of data latches to the shared set of transfer latches and subsequently transferring a second half word of data from the first set of data latches to the shared set of transfer latches; and
transferring the sensing results latched in the second set of data latches to the shared set of transfer latches includes:
transferring a first half word of data from the second set of data latches to the shared set of transfer latches and subsequently transferring a second half word of data from the second set of data latches to the shared set of transfer latches.

16. A method, comprising:
receiving a first word of N bits of data, N being an integer greater than one;
transferring the first word of data to a first set of data latches associated with a first column of a plurality of N bit lines and including one or more data latch for each of the bit lines, comprising:
transferring the first word of data to a shared set of N transfer latches; and
transferring the first word of data from the shared set of transfer latches to the first set of data latches;
receiving a second word of N bits of data;
subsequent to transferring the first word of data to the shared set of transfer latches, transferring the second word of data to a second set of data latches associated with a second column of a plurality of N bit lines and including one or more data latch for each of the bit lines, comprising:

transferring the second word of data to the shared set of transfer latches; and transferring the second word of data from the shared set of transfer latches to the second set of data latches; and concurrently programming the first word of data and the second word of data as stored in the first set of data latches and the second set of data latches into selected memory cells connected to the bit lines for the first column and second column, respectively.

17. The method of claim 16, wherein:

the bit lines of a column are a contiguous set of columns of an array of memory cells, and a word of data is programmed into the memory cells of the column as a first half word and a second half word, the bit lines of the column storing the first half word being interleaved with the bit lines of the column storing the second half word.

18. The method of claim 17, wherein the shared transfer latches are connected to the first set of data latches and to the second set of data latches over an internal bus structure having a width of a half word of data, and wherein:

transferring the first word of data from the shared set of transfer latches to the first set of data latches includes:

transferring a first half word of the first word of data from the shared set of transfer latches to the first set of data latches and subsequently transferring a second half word of the first word of data from the shared set of transfer latches to the first set of data latches; and transferring the second word of data from the shared set of transfer latches to the second set of data latches includes:

transferring a first half word of the second word of data from the shared set of transfer latches to the second set of data latches and subsequently transferring a second half word of the second word of data from the shared set of transfer latches to the second set of data latches.

19. The method of claim 16, wherein programming the first word of data and the second word of data is a multi-state programming operation and the first set of data latches and second set of data latches each include a plurality of latches for each of the bit lines of the corresponding column.

* * * * *